United States Patent
Chandhok et al.

(10) Patent No.: US 11,264,325 B2
(45) Date of Patent: Mar. 1, 2022

(54) INTERCONNECTS HAVING A PORTION WITHOUT A LINER MATERIAL AND RELATED STRUCTURES, DEVICES, AND METHODS

(71) Applicant: INTEL CORPORATION, Santa Clara, CA (US)

(72) Inventors: Manish Chandhok, Beaverton, OR (US); Richard Schenker, Portland, OR (US); Tristan Tronic, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 16/628,991

(22) PCT Filed: Sep. 28, 2017

(86) PCT No.: PCT/US2017/054018
§ 371 (c)(1),
(2) Date: Jan. 6, 2020

(87) PCT Pub. No.: WO2019/066855
PCT Pub. Date: Apr. 4, 2019

(65) Prior Publication Data
US 2020/0126912 A1      Apr. 23, 2020

(51) Int. Cl.
*H01L 23/528* (2006.01)
*H01L 21/768* (2006.01)
*H01L 23/532* (2006.01)

(52) U.S. Cl.
CPC ...... *H01L 23/5283* (2013.01); *H01L 21/7682* (2013.01); *H01L 21/76832* (2013.01);
(Continued)

(58) Field of Classification Search
CPC ............. H01L 23/5283; H01L 21/7682; H01L 21/76832; H01L 21/76846; H01L 23/53223; H01L 23/53266
See application file for complete search history.

(56) References Cited

U.S. PATENT DOCUMENTS 7,488,679 B2 * 2/2009 Standaert .......... H01L 21/76805
257/750
9,455,403 B1     9/2016 Lai et al.
(Continued)

FOREIGN PATENT DOCUMENTS

EP            3034655 A1    6/2016
KR     1020160014558 A     2/2016

OTHER PUBLICATIONS

PCT/US2017/054018, International Search Report and Written Opinion, dated Jun. 21, 2018, 13 pages.

*Primary Examiner* — Shahed Ahmed
*Assistant Examiner* — Vicki B. Booker
(74) *Attorney, Agent, or Firm* — Schwabe, Williamson & Wyatt, P.C.

(57) ABSTRACT

Integrated circuit (IC) structures, computing devices, and related methods are disclosed. An IC structure includes an interlayer dielectric (ILD), an interconnect, and a liner material separating the interconnect from the ILD. The interconnect includes a first end extending to or into the ILD and a second end opposite the first end. A second portion of the interconnect extending from the second end to a first portion of the interconnect proximate to the first end does not include the liner material thereon. A method of manufacturing an IC structure includes removing an ILD from between interconnects, applying a conformal hermetic liner, applying a carbon hard mask (CHM) between the interconnects, removing a portion of the CHM, removing the conformal hermetic liner to a remaining CHM, and removing
(Continued)

the exposed portion of the liner material to the remaining CHM to expose the second portion of the interconnects.

27 Claims, 7 Drawing Sheets

(52) U.S. Cl.
CPC .. *H01L 21/76846* (2013.01); *H01L 23/53223* (2013.01); *H01L 23/53266* (2013.01)

(56) References Cited

U.S. PATENT DOCUMENTS

| | | |
|---|---|---|
| 2014/0264864 A1 | 9/2014 | Weng et al. |
| 2016/0197013 A1 | 7/2016 | Backes et al. |

\* cited by examiner

INTERCONNECTS HAVING A PORTION WITHOUT A LINER MATERIAL AND RELATED STRUCTURES, DEVICES, AND METHODS

CROSS-REFERENCE TO RELATED APPLICATIONS

This application is a U.S. National Phase application under 35 U.S.C. § 371 of International Application No. PCT/2017/054018, filed Sep. 28, 2017, the entire contents of which are hereby incorporated by reference herein.

TECHNICAL FIELD

The disclosure relates to interconnects having at least a portion that is unlined by a liner material. More specifically, the disclosure relates to semiconductor devices having partially unlined interconnects.

BACKGROUND

Back end of line (BEOL) processing for semiconductor devices (e.g., integrated circuit (IC) devices and structures) involves interconnecting electrical components (e.g., transistors, memory cells, resistors, capacitors, other components, or combinations thereof). Typically, BEOL processing involves formation of electrically conductive structures (e.g., contacts, interconnects, etc.) and electrically insulating structures (e.g., interlayer dielectric (ILD) structures) for interconnecting the electrical components.

DETAILED DESCRIPTION OF PREFERRED EMBODIMENTS

Figure 1:
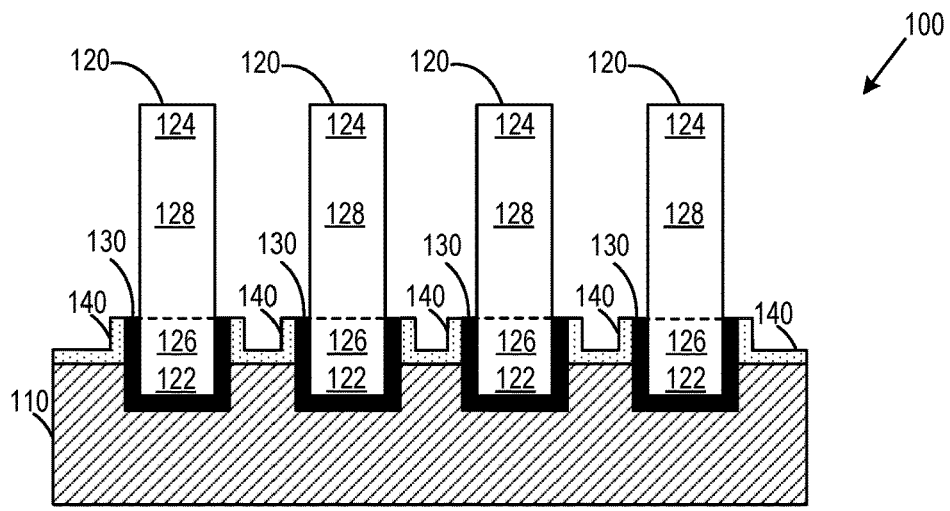
FIG. 1 is a simplified cross-sectional view of a back end of line (BEOL) structure, according to some embodiments.

Described herein are interconnects having at least a portion that is unlined by a liner material, and related structures, devices, and methods. In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is helpful in understanding the present disclosure; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

Demand for smaller and smaller semiconductor devices has driven scaling pitch of structures on or in the semiconductor devices smaller and smaller. This scaling pitch can be limited, however, by size constraints for forming interconnects.

Interconnects through ILD structures often include liners to improve adhesion of the interconnects to the ILD structures. These interconnects often also include barrier materials to prevent electrically conductive material of the interconnects from diffusing into the ILD structures. Current scaling of liner materials and barrier materials has limits (e.g., about one nanometer (1 nm) minimum pitch for each of the liner material and the barrier material) to prevent discontinuities. As a result, scaling of interconnects, and by extension BEOL structures and semiconductor devices as a whole, may be impacted by the scaling limits of liner materials and/or barrier materials. Also, resistance of interconnects may be relatively high when a significant fraction of the overall cross-sectional area thereof includes liner materials and/or barrier materials, as these materials generally have higher electrical resistivity than electrically conductive materials used for the interconnects. Furthermore, capacitance between interconnects may be relatively high if the interconnects are placed relatively close together to compensate for the limited scaling of the interconnects. Relatively high resistance and capacitance impact speed of operation (which is impacted proportionally to the product of the resistance and the capacitance of the interconnects).

Scaling of interconnects may be improved if portions of liner materials and/or barrier materials are removed from the interconnects during BEOL processing. In some embodiments, an IC structure (e.g., a BEOL structure) includes an ILD material and an interconnect. The interconnect includes a first end extending to or into the ILD material and a second end opposite the first end. A portion of the interconnect proximate to the second end does not include a liner material thereon.

FIG. 1 is a simplified cross-sectional view of a back end of line (BEOL) structure 100, according to some embodiments. The BEOL structure 100 may form part of a semiconductor structure, which includes electrical components that the BEOL structure 100 provides interconnects to. The BEOL structure 100 includes an ILD material 110, one or more interconnects 120, a liner material 130, and a remnant of a hermetic liner material 140. The ILD material 110 includes an electrically insulating material (e.g., SiO, $SiO_2$, low-k dielectrics, etc.).

The interconnects 120 each include electrically conductive material. By way of non-limiting example, the electrically conductive material of the interconnects 120 may include a metal (e.g., Cu, Co, Ru, Al, etc.). The interconnects 120 illustrated in FIG. 1 each include a first end 122 extending into the ILD material 110 and a second end 124 opposite the first end 122. Although the first ends 122 of the interconnects 120 of FIG. 1 extend into the ILD material 110, it is contemplated within the scope of the disclosure that the first ends 122 of the interconnects 120 may instead extend to the ILD material 110, without extending into the ILD material 110. The interconnects 120 each also include a first portion 126 proximate to the first end 122 and a second portion 128 proximate to the second end 124 (a conceptual dashed line is shown dividing the first portion 126 from the second portion 128).

The liner material 130 extends over the first ends 122 and the first portions 126 of the interconnects 120. Ends of the liner material 130 opposite the first ends 122 of the interconnects 120 may define boundaries between the first portion 126 and the second portion 128 of the interconnects 120. The liner material 130 may include a material that can be etched. By way of non-limiting example, the liner material 130 may include TiN, Ti, Ru, TaN, MoN, other liner materials, or combinations thereof. The liner material 130 is configured to improve adhesion of the interconnects 120 to the ILD material 110. In some embodiments, the liner material 130 also includes a barrier material (not shown) on an inside portion of the liner 130 (i.e., the part of the liner 130 that contacts the interconnects 120). In such embodiments, the liner material 130 of FIG. 1 represents both the liner and the barrier. The barrier material is configured to prevent the electrically conductive material of the interconnects 120 from passing through the liner material 130.

The hermetic liner material 140 is in contact with the ILD material 110 and is adjacent to at least part of the first portion 126 of each interconnect 120. As a result, the liner material 130 separates the interconnects 120 from the ILD material 110 and the remnant hermetic liner material 140. The remnant of the hermetic liner material 140 may be conformal, may be relatively dense, and may have a relatively high dielectric constant (e.g., a dielectric constant that is higher than that of the ILD material 110). By way of non-limiting example, the remnant of the hermetic liner material 140 may include $HfO_2$ (with a dielectric constant of about 20), $Al_2O_3$ (with a dielectric constant of about 9), carbon doped SiN (with a dielectric constant of about 7), SiOCN (with a dielectric constant of about 5), other materials, or combinations thereof. As will be discussed below with reference to FIGS. 4 and 5, the hermetic liner material 140 of FIG. 1 may be a remnant of a sacrificial material used during processing of the BEOL structure 100 to seal the interconnects 120, the liner material 130, and the ILD 110 from a carbon hard mask (CHM) material 550 (e.g., to provide an at least partial barrier to diffusion of the CHM to the interconnects 120, the liner material 130, and the ILD 110). In some embodiments, a thickness of the hermetic liner material 140 is about two nanometers (2 nm).

As illustrated in FIG. 1, the second portion 128 of the interconnects 120 extending from the second end 124 to the first portion 126 does not include the liner material 130 thereon. As a result, scaling of interconnects may be improved because the interconnects 120 may be placed closer together than interconnects including liner materials covering the second portions thereof without increasing capacitance between the interconnects 120 (i.e., because the distance between the interconnects 120 without the liner material 130 on the second portions is less than the distance between the liner materials of interconnects with liners on the second portions thereof).

In addition to, or instead of, placing the interconnects 120 relatively closely together, a resistance of the interconnects 120 may be decreased compared to a resistance of interconnects that have liner materials on the second portions thereof (i.e., because the electrically conductive material of the interconnects 120 may occupy volume that would otherwise be occupied by liner material and/or barrier material, both of which are less electrically conductive than typical materials of the interconnects 120). In such embodiments, a higher conductivity of the interconnects 120 may result in improved thermal conductivity, which may improve dispersion of self-heating from semiconductor devices coupled to the BEOL structure 100. Furthermore, a larger quantity of electrically conductive material in the interconnects 120 may result in greater structural strength than structures that include liner materials and/or barrier materials occupying some of the volume that could be occupied by the interconnect material.

In some embodiments, a distance from the second end 124 of the interconnects 120 to the portion of the interconnects 120 that extends from the ILD material 110 (e.g., the boundary between the first portion 126 and the second portion 128) may be about eighty percent (80%) of a total length of the interconnects 120 from the first end 122 to the second end 124.

In some embodiments, air gaps 272 may remain between the second portions 128 of the interconnects 120. In some such embodiments, the air gaps 272 may be encapsulated, as will be discussed below with reference to FIG. 2.

In some embodiments, the air gaps 272 between the second portions 128 of the interconnects 120 may be filled with a replacement ILD 380, as will be discussed below with reference to FIG. 3.

Figure 2:
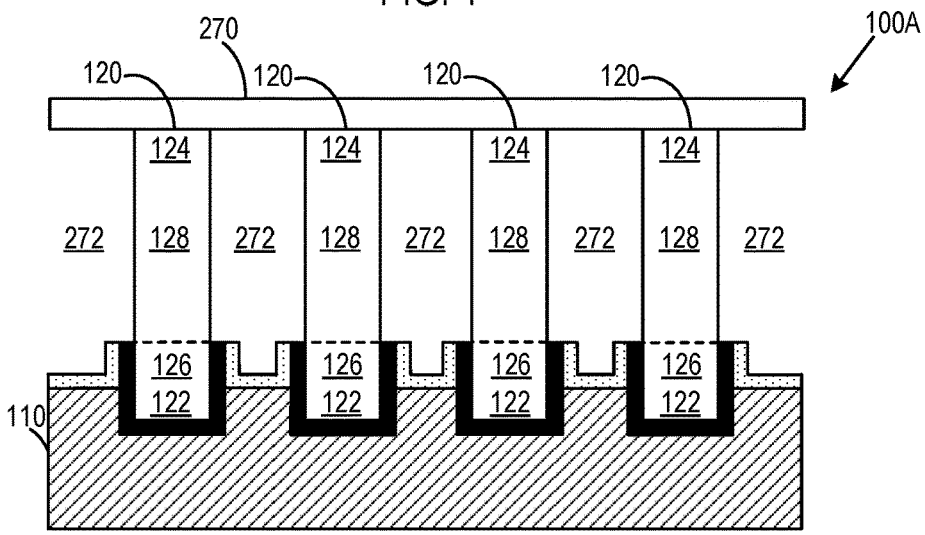
FIG. 2 is a simplified cross-sectional view of the BEOL structure of FIG. 1 that has been encapsulated.

FIG. 2 is a simplified cross-sectional view of an example BEOL structure 100A of the BEOL structure 100 of FIG. 1 that has been encapsulated. The BEOL structure 100A includes air gaps 272 adjacent to the second portions 128 of the interconnects 120 and an encapsulation structure 270 to encapsulate the air gaps 272. In some embodiments, the encapsulation structure 270 may include SiC, SiCN, other materials, or combinations thereof.

In embodiments where it is desired to form vias from BEOL structures that will be formed on top of the BEOL structure 100A, via material may unintentionally push into the air gaps 272, which may cause device failures (e.g., short circuits). As a result, where vias from above will be formed, at least part of the BEOL structure 100 may be refilled with a replacement ILD material 380.

Figure 3:
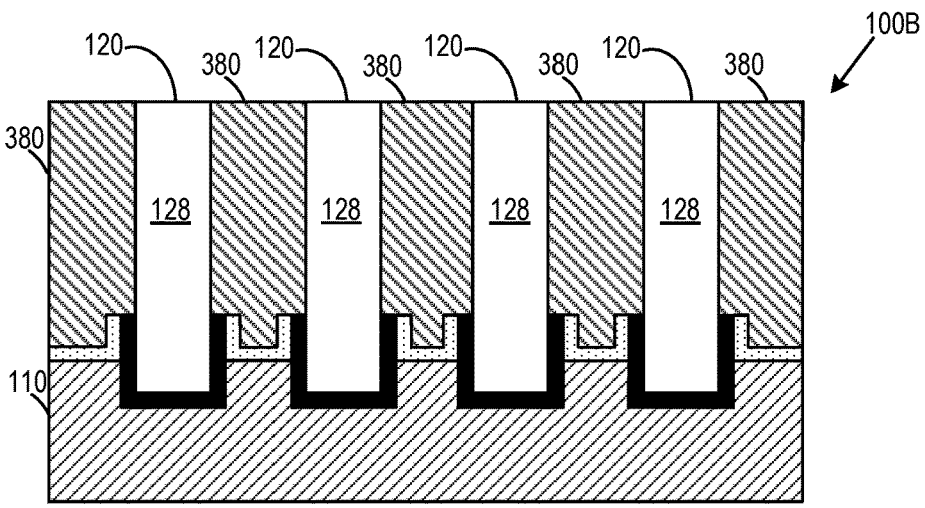
FIG. 3 is a simplified cross-sectional view of the BEOL structure of FIG. 1 that has been refilled with a replacement ILD material.

FIG. 3 is a simplified cross-sectional view of an example BEOL structure 100B of the BEOL structure 100 of FIG. 1 that has been refilled with a replacement ILD material 380. As a result, the BEOL structure 100 of FIG. 1 includes the replacement ILD material 380 proximate to the second portions 128 of the interconnects 120. In some embodiments, a replacement dielectric constant of the replacement ILD material 380 is less than a dielectric constant of the ILD material 110. By way of non-limiting example, the replacement dielectric constant may be between about 1.9 and 2.1, and the dielectric constant of the ILD material 110 may be between about 2.9 and 3.5. In some embodiments, the replacement ILD material 380 may include a porous dielectric to achieve a relatively low dielectric constant. A relatively low dielectric constant of the replacement ILD material 380 may enable decreased capacitance between the interconnects 120, resulting in better speed performance.

In some embodiments, a BEOL structure 100 may include portions where encapsulation is used, and portions where replacement ILD material 380 is used.

Figure 4:
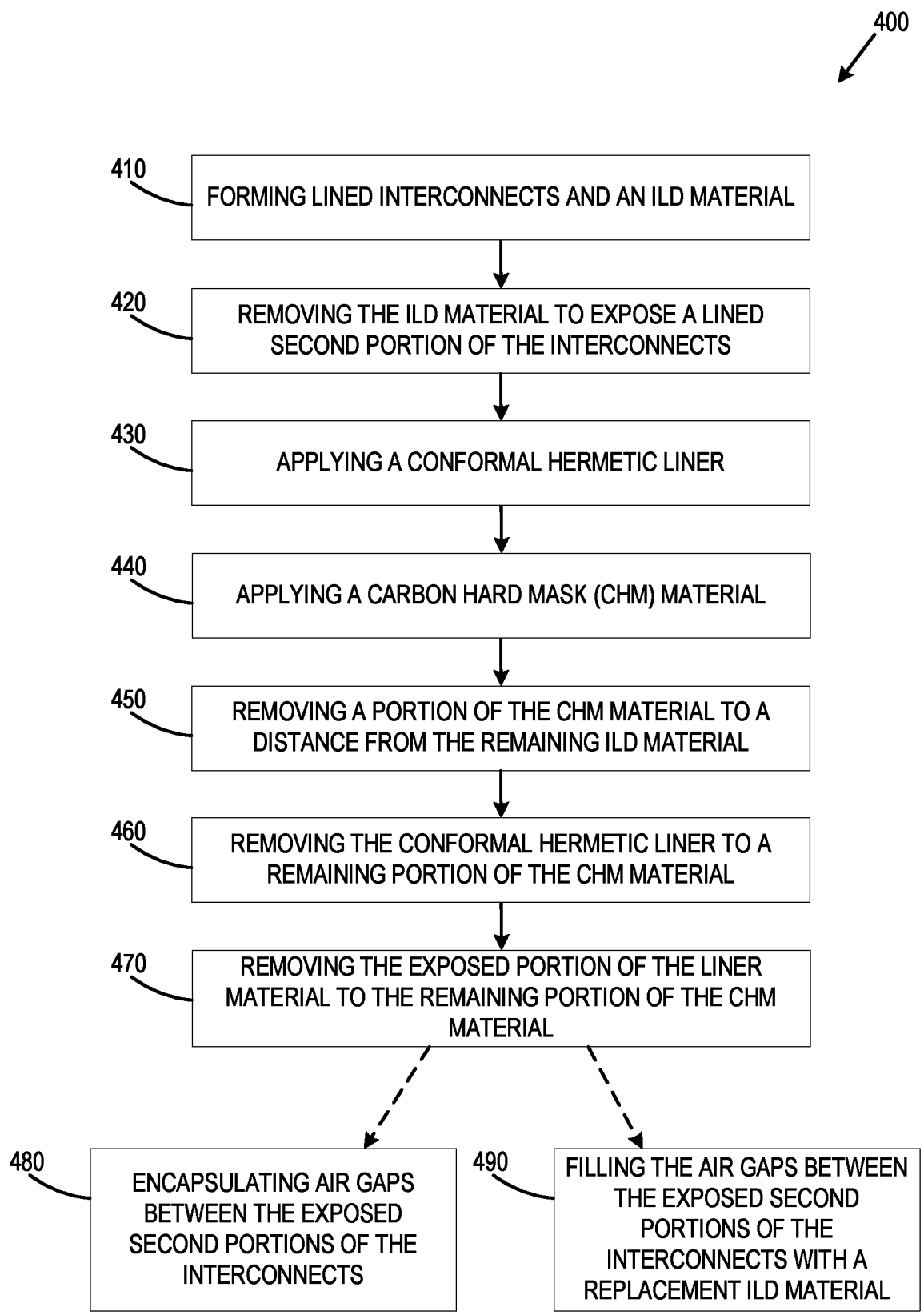
FIG. 4 is a simplified flowchart illustrating a method of manufacturing a BEOL structure, according to some embodiments.

FIG. 4 is a simplified flowchart illustrating a method 400 of manufacturing a BEOL structure (e.g., the BEOL structures 100, 100A, or 100B of FIGS. 1-3), according to some embodiments.

FIGS. 5A-5I are simplified cross-sectional views of a BEOL structure 500 to illustrate the method 400 of FIG. 4.

Figure 5A:
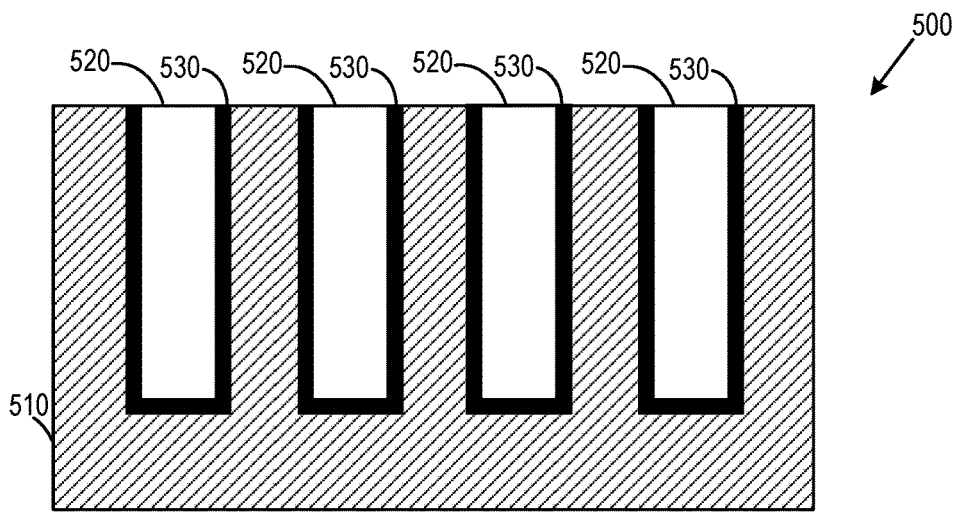
FIGS. 5A-5I are simplified cross-sectional views of a BEOL structure to illustrate the method of FIG. 4.

Referring to FIGS. 4 and 5A-5I together, the method 400 includes forming 410 lined interconnects 520 and an ILD material 510. FIG. 5A shows the BEOL structure 500 including the interconnects 520 extending through the ILD material 510 and including liners 530 thereon. The interconnects 520, the liner material 530, and the ILD material 510 may be similar to the interconnects 120, the liner material 130, and the ILD material 110 discussed above with reference to FIG. 1.

Figure 5B:
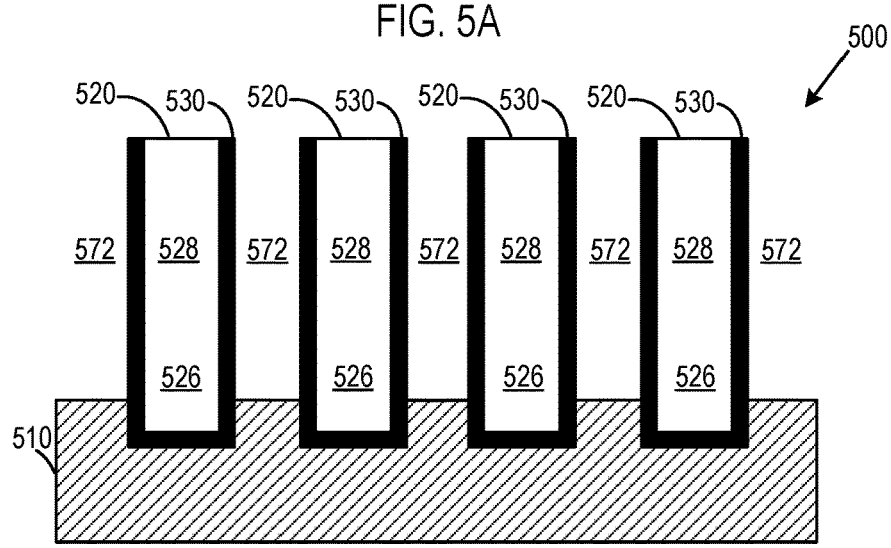

The method 400 also includes removing 420 the ILD material 510 from between the interconnects 520 to expose a portion of the liner material 530 that covers a second portion 528 of the interconnects 520. FIG. 5B shows an example of the resulting BEOL structure 500. Part of a first portion 526 of each of the interconnects 520 may extend into the ILD material 510. In some embodiments, the removing 420 of the ILD material 510 may include exposing a portion of the liner material that covers about eighty percent (80%) of a length of the interconnects 520. In some embodiments, more or less than 80% of the interconnects 520 may be exposed. In some embodiments, the removing 420 of the ILD material 510 may include removing the ILD material 510 using a dry etch to form air gaps 572 between the interconnects 520. Such an etching process may be referred to as an "air gap etch."

Figure 5C:
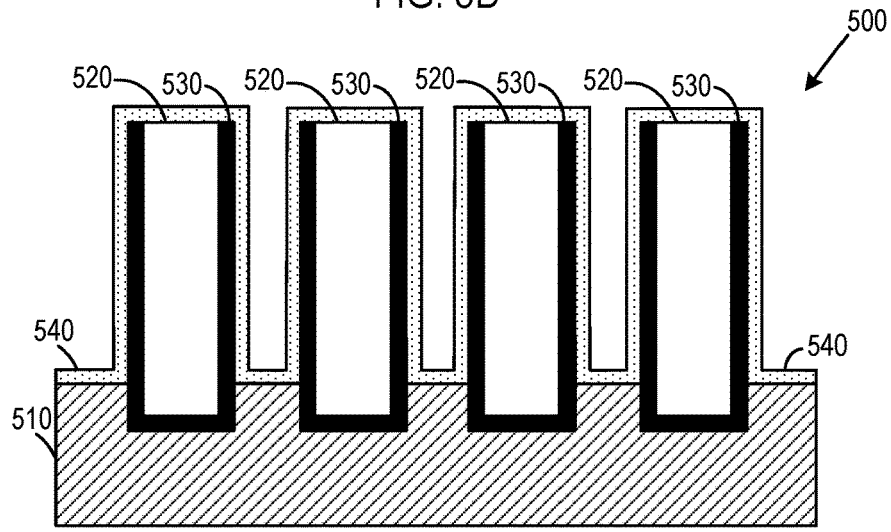

The method 400 further includes applying 430 a conformal hermetic liner 540 to a remaining ILD material 510 and the exposed portion of the liner material 530 and interconnects 520. The conformal hermetic liner 540 may be similar to the hermetic liner material 140 discussed above with reference to FIG. 1. FIG. 5C illustrates an example of the resulting BEOL structure 500. In some embodiments, applying 430 a conformal hermetic liner 540 includes depositing about two nanometers (2 nm) of the conformal hermetic liner 540. In some embodiments, applying 430 a conformal hermetic liner 540 includes applying at least one of $HfO_2$ (with a dielectric constant of about 20), $Al_2O_3$ (with a dielectric constant of about 9), carbon doped SiN (with a dielectric constant of about 7), SiOCN (with a dielectric constant of about 5), other materials, or combinations thereof.

Figure 5D:
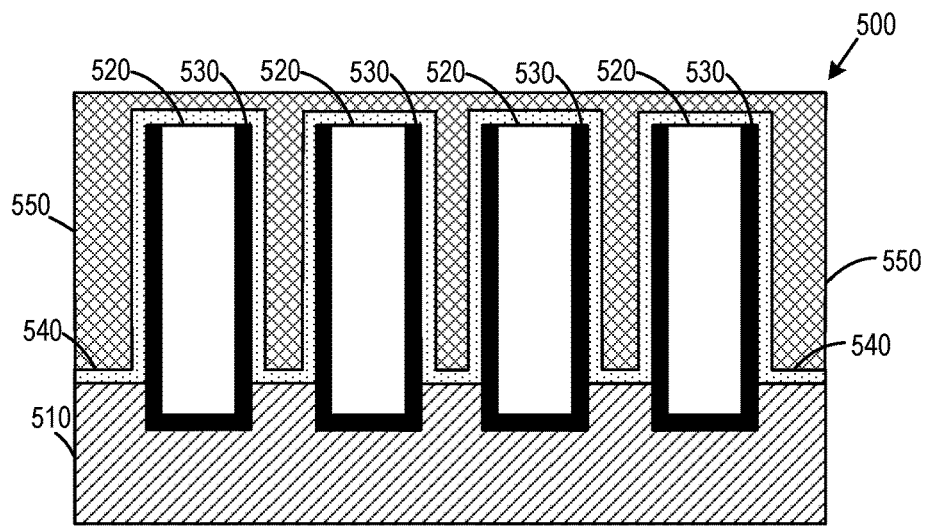

The method 400 also includes applying 440 a carbon hard mask (CHM) material 550 (e.g., an amorphous carbon material or carbon compound) between the interconnects 520. FIG. 5D illustrates the CHM material 550 on the BEOL structure 500. In some embodiments, applying 440 the CHM material 550 includes spinning on the CHM material 550. The conformal hermetic liner 540 applied 430 as discussed above may, at this point, serve as a sacrificial material used during processing of the BEOL structure 500 to seal the interconnects 520, the liner material 530, and the ILD 510 from the CHM material 550 (e.g., to provide an at least partial barrier to diffusion of the CHM to the interconnects 520, the liner material 530, and the ILD 510).

Figure 5E:
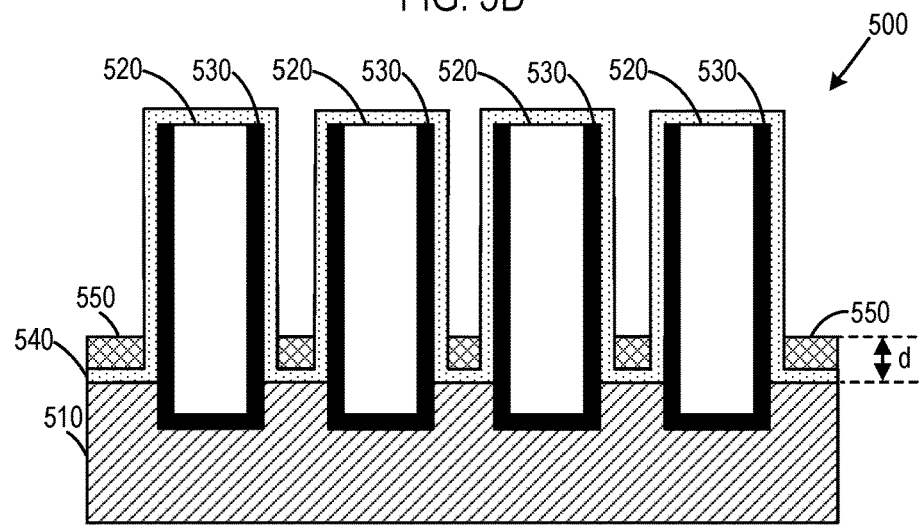

The method 400 further includes removing 450 a portion of the CHM material 550 to a distanced from the remaining ILD material 510. FIG. 5E illustrates the CHM material 550 removed to the distance d from the remaining ILD material 510. In some embodiments, removing 450 the portion of the CHM material 550 includes etching the CHM material 550 back to the distance d from the remaining ILD material 510.

Figure 5F:
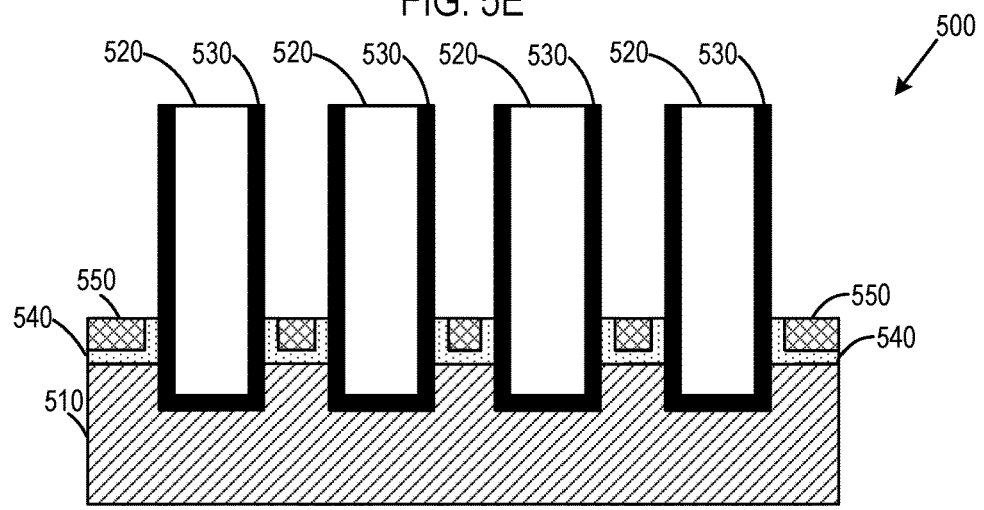

The method 400 also includes removing 460 the conformal hermetic liner 540 from the exposed portion of the liner material 530 to a remaining portion of the CHM material 550. An example of the resulting BEOL structure 500 is shown in FIG. 5F. In some embodiments, removing 460 the conformal hermetic liner 540 includes etching the hermetic liner 540 using wet etch chemistry.

Figure 5G:
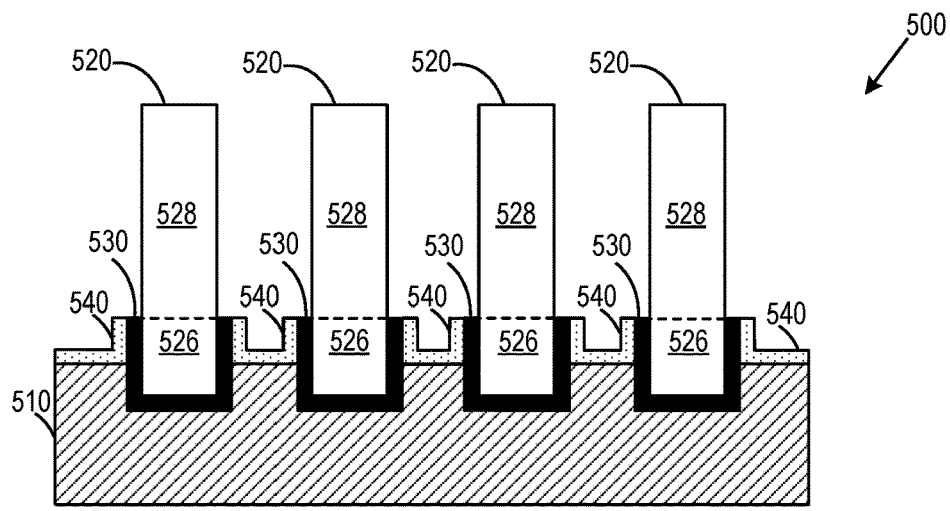

The method 400 further includes removing 470 the exposed portion of the liner material 530 to the remaining portion of the CHM material 550 to expose the second portion 528 of the interconnects 520. An example of the resulting BEOL structure 500 is illustrated in FIG. 5G. Although not shown, a trace, a portion, or all of the CHM material 550 may remain in some embodiments. In some embodiments, removing 470 the exposed portion of the liner material 530 includes etching the exposed portion with a piranha etch. It will be noted that the BEOL structure 500 of FIG. 5G is similar to the BEOL structure 100 of FIG. 1.

Figure 5H:
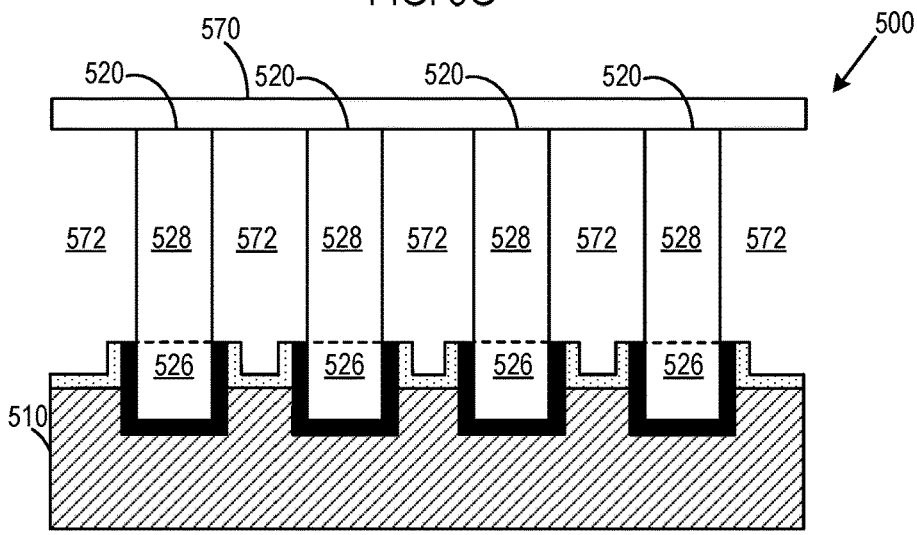

In embodiments where the BEOL structure 500 is encapsulated, the method 400 includes encapsulating 480 air gaps 572 between the exposed second portions 528 of the interconnects 520 with an encapsulation material 570. An example of the resulting BEOL structure 500 is illustrated in FIG. 5H. The encapsulation material 570 may be similar to the encapsulation material 270 discussed with reference to FIG. 2. In some embodiments, encapsulating 480 the air gaps 572 comprises disposing the encapsulation material 570 over the interconnects 520.

Figure 5I:
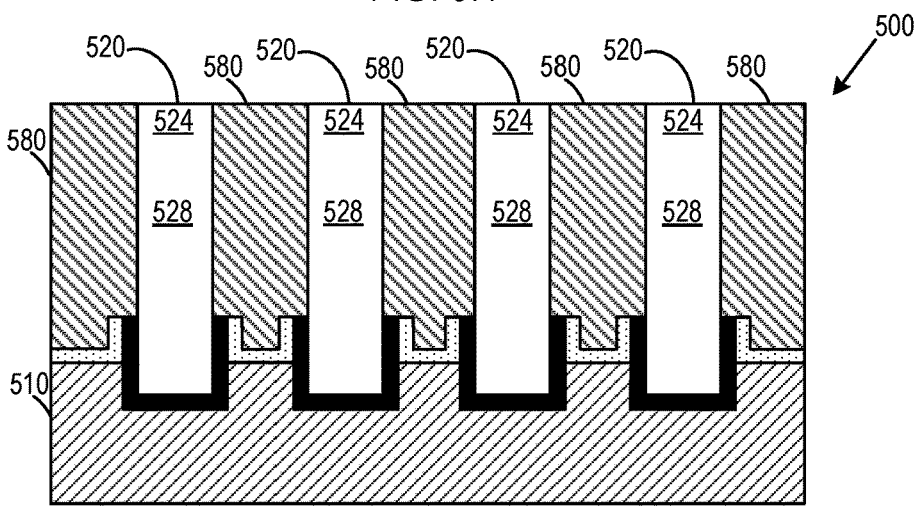

In embodiments where a replacement ILD material 580 is used, the method 400 includes filling 490 the air gaps 572 between the exposed second portions 528 of the interconnects 520 with the replacement ILD material 580. An example of the resulting BEOL structure 500 is illustrated in FIG. 5I. The replacement ILD material 580 may be similar to the replacement ILD material 380 discussed with reference to FIG. 3. In some embodiments, the replacement ILD material 580 may be disposed (e.g., spun on, deposited, etc.) with the replacement ILD material 580 covering the second ends 524 of the interconnects 520. In some such embodiments, a portion of the replacement ILD material 580 may be removed (e.g., polished) until a top of the replacement ILD material 580 is about even with the second ends 524 of the interconnects 520, as illustrated in FIG. 5I.

Figure 6:
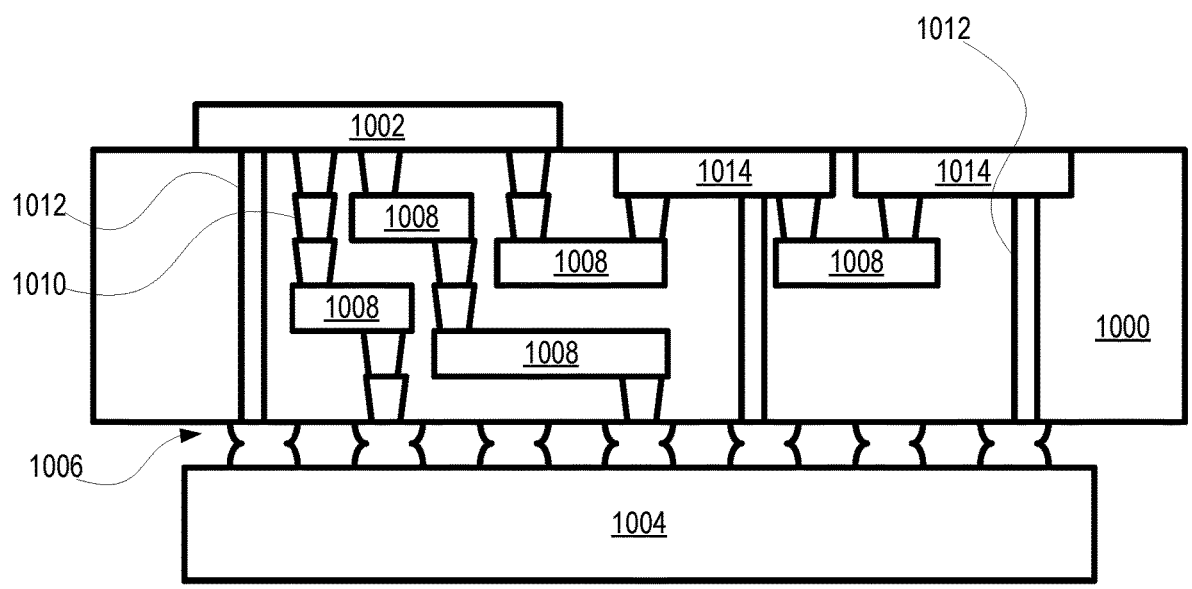
FIG. 6 illustrates an interposer that includes one or more embodiments of the disclosure.

FIG. 6 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of interposer 1000.

Figure 7:
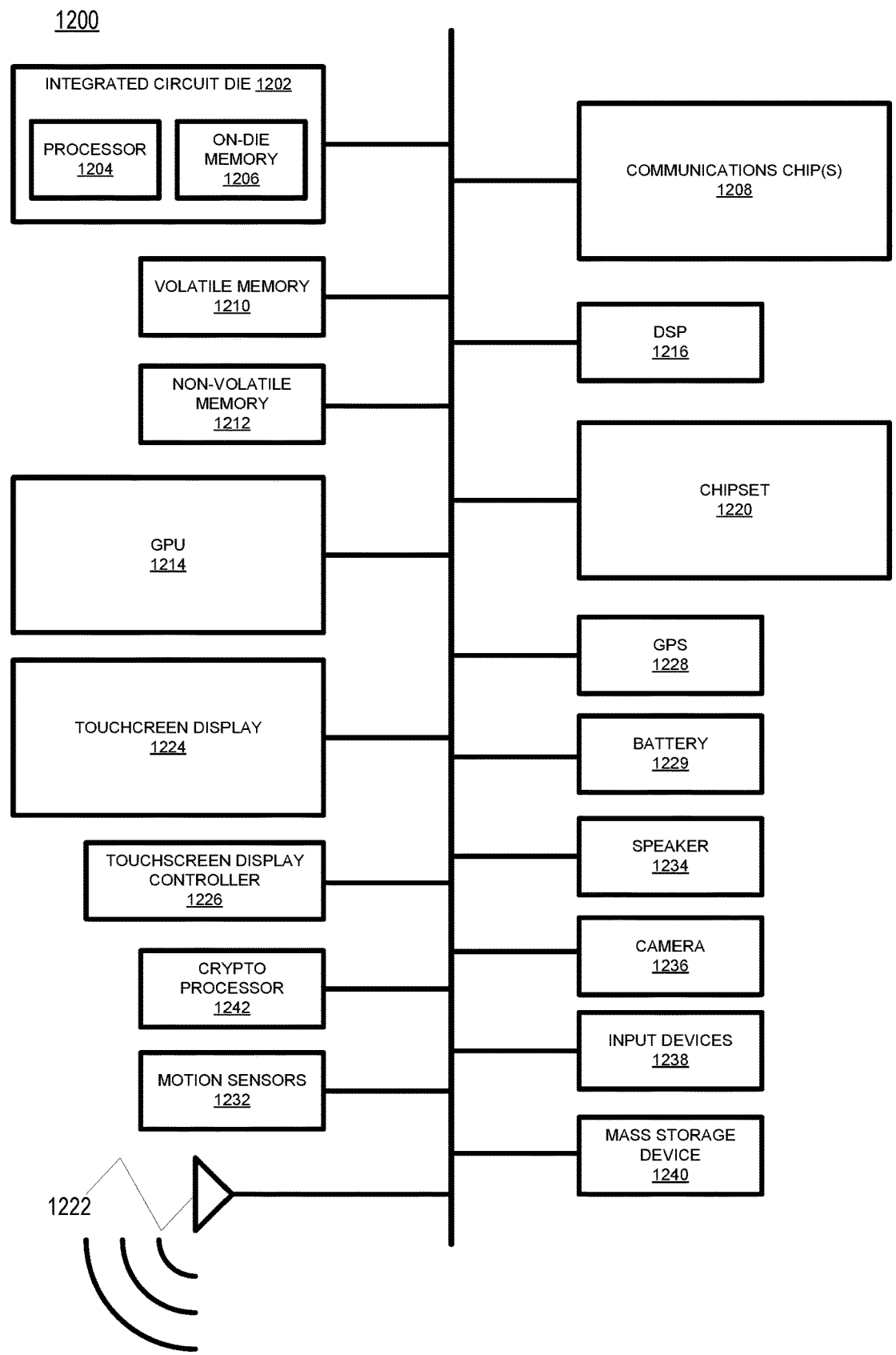
FIG. 7 illustrates a computing device in accordance with one embodiment of the disclosure.

FIG. 7 illustrates a computing device 1200 in accordance with one embodiment of the disclosure. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications logic unit 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a CPU 1204 as well as on-die memory 1206, often used as cache memory, that can be provided by technologies such as embedded DRAM (eDRAM), SRAM, or spin-transfer torque memory (STT-M RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen controller 1226, a battery 1229 or other power source, a power amplifier (not shown), a voltage regulator (not shown), a global positioning system (GPS) device 1228, a compass (not shown), a motion coprocessor or sensors 1232 (that may include an accelerometer, a gyroscope, and a compass), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, and derivatives thereof, as well as any other wireless protocols that are designated as 3G, 4G, 5G, and beyond. The computing device 1200 may include a plurality of communications logic units 1208. For instance, a first communications logic unit 1208 may be dedicated to shorter range wireless communications such as Wi-Fi, NFC, and Bluetooth, and a second communications logic unit 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors or metal interconnects, that are formed in accordance with embodiments of the disclosure. The term "processor" may refer to any device or portion of a device that processes electronic data from registers and/or memory to transform that electronic data into other electronic data that may be stored in registers and/or memory.

The communications logic unit 1208 may also include one or more devices, such as BEOL structures 100, 500 that are formed in accordance with implementations of the disclosure.

In further embodiments, another component housed within the computing device 1200 may contain one or more devices, such as BEOL structures 100, 500 that are formed in accordance with implementations of the disclosure.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

The following is a non-exhaustive list of example embodiments that fall within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below, and the above disclosed embodiments, are not combinable, it is contemplated within the scope of the disclosure that such examples and embodiments are combinable.

Example 1

An integrated circuit (IC) structure, comprising: an interlayer dielectric (ILD) material; an interconnect comprising electrically conductive material and including a first portion proximate to a first end of the interconnect and a second portion proximate to a second end of the interconnect, the first end extending to or into the ILD material and the second end opposite the first end; and a liner material around the first portion of the interconnect and between the first end of the interconnect and the ILD material, wherein an end of the liner material opposite the first end of the interconnect defines a boundary between the first portion of the interconnect and the second portion of the interconnect.

Example 2

The IC structure of Example 1, further comprising a remnant of a hermetic liner material in contact with the ILD material and adjacent to at least part of the first portion of the interconnect, wherein the liner material is between the interconnect from and ILD material and between the interconnect and the remnant of the hermetic liner material.

Example 3

The IC structure of Example 2, wherein a thickness of the remnant of the hermetic liner material is about two nanometers (2 nm).

Example 4

The IC structure according to any one of Examples 2 and 3, wherein the remnant of the hermetic liner material includes $HfO_2$, $Al_2O_3$, carbon doped SiN, or combinations thereof.

Example 5

The IC structure according to any one of Examples 1-4, wherein a distance from the second end of the interconnect to the first portion of the interconnect is about eighty percent (80%) of a total length of the interconnect from the first end to the second end.

Example 6

The IC structure according to any one of Examples 1-5, further comprising an air gap adjacent to the second portion of the interconnect.

Example 7

The IC structure of Example 6, further comprising an encapsulation material adjacent to the second end of the interconnect and configured to encapsulate the air gap.

Example 8

The IC structure according to any one of Examples 1-5, further comprising a replacement ILD material adjacent to the second portion of the interconnect.

Example 9

The IC structure of Example 8, wherein a replacement dielectric constant of the replacement ILD material is less than a dielectric constant of the ILD material.

Example 10

The IC structure of Example 9, wherein the replacement dielectric constant is between about 1.9 and 2.1, and the dielectric constant is between about 2.9 and 3.5.

Example 11

A method of manufacturing an integrated circuit (IC) structure, the method comprising: removing an interlayer dielectric (ILD) material from between interconnects that are at least partially covered with a liner material to expose a portion of the liner material that covers a second portion of the interconnects; applying a conformal hermetic liner to a remaining ILD material and the exposed portion of the liner material; applying a carbon hard mask (CHM) between the interconnects; removing a portion of the CHM to a distance from the remaining ILD; removing the conformal hermetic liner from the exposed portion of the liner material to a remaining portion of the CHM; and removing the exposed portion of the liner material to the remaining portion of the CHM to expose the second portion of the interconnects.

Example 12

The method of Example 11, wherein removing an ILD material from between interconnects comprises removing the ILD material using a dry etch to form air gaps between the interconnects.

Example 13

The method according to any one of Examples 11 and 12, wherein removing an ILD material from between interconnects comprises exposing a portion of the liner material that covers about eighty percent (80%) of a length of the interconnects.

Example 14

The method according to any one of Examples 11-13, wherein applying a conformal hermetic liner comprises depositing about two nanometers (2 nm) of the conformal hermetic liner.

Example 15

The method according to any one of Examples 11-14, wherein applying a conformal hermetic liner comprises applying at least one material selected from the group consisting of $HfO_2$, $Al_2O_3$, and carbon doped SiN.

Example 16

The method according to any one of Examples 11-15, wherein applying a CHM comprises spinning on the CHM.

Example 17

The method according to any one of Examples 11-16, wherein removing a portion of the CHM comprises etching the CHM back to the distance from the remaining ILD.

Example 18

The method according to any one of Examples 11-17, wherein removing the conformal hermetic liner comprises etching the hermetic liner using wet etch chemistry.

Example 19

The method according to any one of Examples 11-18, wherein removing the exposed portion of the liner material comprises etching the exposed portion with a piranha etch.

Example 20

The method according to any one of Examples 11-19, further comprising encapsulating air gaps between the exposed second portion of the interconnects with an encapsulation material.

Example 21

The method according to any one of Examples 11-19, further comprising filling gaps between the exposed second portion of the interconnects with a replacement ILD.

Example 22

A computing device comprising: at least one integrated circuit (IC) structure including: a plurality of interconnects, each having a first portion at a first end thereof covered with a liner material and a second portion at a second end thereof without the liner material; a hermetic liner between the first portion of the interconnects; and an interlayer dielectric (ILD) proximate at least part of the liner material at the first end of each of the plurality of interconnects.

Example 23

The computing device of Example 22, further comprising: a processor mounted on a substrate; a memory unit capable of storing data; a graphics processing unit; an antenna within the computing device; a display on the computing device; a battery within the computing device; a power amplifier within the processor; and a voltage regulator within the processor; wherein at least one of the processor, the memory unit, the graphics processing unit, the antenna, the display, the battery, the power amplifier, and the voltage regulator comprises the at least one IC structure.

Example 24

A method of manufacturing an integrated circuit (IC) structure, the method comprising: forming an interlayer dielectric (ILD) material; forming an interconnect comprising electrically conductive material and including a first end extending to or into the ILD material and a second end opposite the first end; forming a liner material separating the interconnect from the ILD material; and removing the liner material from a second portion of the interconnect extending from the second end to a first portion of the interconnect proximate to the first end.

Example 25

The method of Example 24, further comprising forming a hermetic liner material in contact with the ILD material and adjacent to at least part of the first portion of the interconnect, wherein the liner material separates the interconnect from the ILD material and the hermetic liner material.

Example 26

The method of Example 25, wherein a thickness of the hermetic liner material is about two nanometers (2 nm).

Example 27

The method according to any one of Examples 25 and 26, wherein the hermetic liner material includes $HfO_2$, $Al_2O_3$, carbon doped SiN, or combinations thereof.

Example 28

The method according to any one of Examples 24-27, wherein a distance from the second end of the interconnect to the first portion of the interconnect is about eighty percent (80%) of a total length of the interconnect from the first end to the second end.

Example 29

The method according to any one of Examples 24-28, further comprising leaving an air gap adjacent to the second portion of the interconnect.

Example 30

The method of Example 29, further comprising forming an encapsulation material adjacent to the second end of the interconnect, the encapsulation material configured to encapsulate the air gap.

Example 31

The method according to any one of Examples 24-28, further comprising forming a replacement ILD material adjacent to the second portion of the interconnect.

Example 32

The method of Example 31, wherein a replacement dielectric constant of the replacement ILD material is less than a dielectric constant of the ILD material.

Example 33

The method of Example 32, wherein the replacement dielectric constant is between about 1.9 and 2.1, and the dielectric constant is between about 2.9 and 3.5.

Example 34

An integrated circuit (IC) structure, comprising: an interlayer dielectric (ILD) material; interconnects that are at least partially covered with a liner material on a first end of the interconnects, with a portion of the liner material that covers a second portion of the interconnects removed, the first end opposite a second end of the interconnects, and the second portion closer to the second end than to the first end; a conformal hermetic liner proximate to the liner material; and a remnant of a carbon hard mask (CHM) proximate to the conformal hermetic liner.

Example 35

The IC structure of Example 34, further comprising air gaps between the interconnects.

Example 36

The IC structure according to any one of Examples 34 and 35, wherein about eighty percent (80%) of a total length of the interconnects does not have the liner material thereon.

Example 37

The IC structure according to any one of Examples 34-36, wherein the conformal hermetic liner is about nanometers (2 nm) thick.

Example 38

The IC structure according to any one of Examples 34-37, wherein the conformal hermetic liner comprises at least one material selected from the group consisting of $HfO_2$, $Al_2O_3$, and carbon doped SiN.

Example 39

The IC structure according to any one of Examples 34-38, wherein the CHM comprises a spin on CHM.

Example 40

The IC structure according to any one of Examples 34-40, wherein the remnant of the CHM extends from the conformal hermetic liner to about the second portion of the interconnects.

Example 41

The IC structure according to any one of Examples 34-40, further comprising an encapsulation material configured to encapsulate air gaps between the exposed second portion of the interconnects.

Example 42

The IC structure according to any one of Examples 34 and 36-40, further comprising a replacement ILD configured to fill gaps between the exposed second portion of the interconnects.

Example 43

A method of operating a computing device, the method comprising: conducting electrical charge through at least one integrated circuit (IC) structure including: a plurality of interconnects, each having a first portion at a first end thereof covered with a liner material and a second portion at a second end thereof without the liner material; a hermetic liner between the first portion of the interconnects; and an interlayer dielectric (ILD) proximate at least part of the liner material at the first end of each of the plurality of interconnects.

Example 44

The method of Example 43, wherein conducting electrical charge through at least one IC structure comprises conducting the electrical charge through an IC structure of: a processor mounted on a substrate; a memory unit capable of storing data; a graphics processing unit; an antenna within the computing device; a display on the computing device; a battery within the computing device; a power amplifier within the processor; or a voltage regulator within the processor.

Example 45

A computer-readable medium having computer-readable instructions stored thereon, the computer-readable instructions configured to instruct one or more processors to perform at least a portion of the method according to any one of Examples 11-21, 24-33, 43, and 44.

Example 46

A means for performing at least a portion of the method according to any one of Examples 11-21, 24-33, 43, and 44.

COMMENTS

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:
1. An integrated circuit (IC) structure, comprising:
an interlayer dielectric (ILD) material having an uppermost surface;
an interconnect comprising electrically conductive material and including a first portion proximate to a first end of the interconnect and a second portion proximate to a second end of the interconnect, the first end extending to or into the ILD material and the second end opposite the first end; and
a liner material around the first portion of the interconnect and between the first end of the interconnect and the

ILD material, wherein an end of the liner material opposite the first end of the interconnect defines a boundary between the first portion of the interconnect and the second portion of the interconnect, wherein the boundary is above the uppermost surface of the ILD material.

2. The IC structure of claim 1, further comprising a remnant of a hermetic liner material in contact with the ILD material and adjacent to at least part of the first portion of the interconnect, wherein the liner material is between the interconnect and the ILD material and between the interconnect and the remnant of the hermetic liner material.

3. The IC structure of claim 2, wherein a thickness of the remnant of the hermetic liner material is about two nanometers (2 nm).

4. The IC structure of claim 2, wherein the remnant of the hermetic liner material includes $HfO_2$, $Al_2O_3$, carbon doped SiN, or combinations thereof.

5. The IC structure of claim 1, wherein a distance from the second end of the interconnect to the first portion of the interconnect is about eighty percent (80%) of a total length of the interconnect from the first end to the second end.

6. The IC structure of claim 1, further comprising an air gap adjacent to the second portion of the interconnect.

7. The IC structure of claim 6, further comprising an encapsulation material adjacent to the second end of the interconnect and configured to encapsulate the air gap.

8. The IC structure of claim 1, further comprising a replacement ILD material adjacent to the second portion of the interconnect.

9. The IC structure of claim 8, wherein a replacement dielectric constant of the replacement ILD material is less than a dielectric constant of the ILD material.

10. The IC structure of claim 9, wherein the replacement dielectric constant is between about 1.9 and 2.1, and the dielectric constant is between about 2.9 and 3.5.

11. A method of manufacturing an integrated circuit (IC) structure, the method comprising:
removing an interlayer dielectric (ILD) material from between interconnects that are at least partially covered with a liner material to expose a portion of the liner material that covers a second portion of the interconnects;
applying a conformal hermetic liner to a remaining ILD material and the exposed portion of the liner material;
applying a carbon hard mask (CHM) between the interconnects; removing a portion of the CHM to a distance from the remaining ILD;
removing the conformal hermetic liner from the exposed portion of the liner material to a remaining portion of the CHM; and
removing the exposed portion of the liner material to the remaining portion of the CHM to expose the second portion of the interconnects.

12. The method of claim 11, wherein removing an ILD material from between interconnects comprises removing the ILD material using a dry etch to form air gaps between the interconnects.

13. The method of claim 11, wherein removing an ILD material from between interconnects comprises exposing a portion of the liner material that covers about eighty percent (80%) of a length of the interconnects.

14. The method of claim 11, wherein applying a conformal hermetic liner comprises depositing about two nanometers (2 nm) of the conformal hermetic liner.

15. The method of claim 11, wherein applying a conformal hermetic liner comprises applying at least one material selected from the group consisting of $HfO_2$, $Al_2O_3$, and carbon doped SiN.

16. The method of claim 11, wherein applying a CHM comprises spinning on the CHM.

17. The method of claim 11, wherein removing a portion of the CHM comprises etching the CHM back to the distance from the remaining ILD.

18. The method of claim 11, wherein removing the conformal hermetic liner comprises etching the hermetic liner using wet etch chemistry.

19. The method of claim 11, wherein removing the exposed portion of the liner material comprises etching the exposed portion with a piranha etch.

20. The method of claim 11, further comprising encapsulating air gaps between the exposed second portion of the interconnects with an encapsulation material.

21. The method of claim 11, further comprising filling gaps between the exposed second portion of the interconnects with a replacement ILD.

22. A computing device comprising:
at least one integrated circuit (IC) structure including:
a plurality of interconnects, each having a first portion at a first end
thereof covered with a liner material and a second portion at a second end thereof
without the liner material;
a hermetic liner between the first portion of the interconnects; and
an interlayer dielectric (ILD) proximate at least part of the liner material at
the first end of each of the plurality of interconnects.

23. The computing device of claim 22, further comprising:
a processor mounted on a substrate;
a memory unit capable of storing data;
a graphics processing unit;
an antenna within the computing device;
a display on the computing device;
a battery within the computing device;
a power amplifier within the processor; and
a voltage regulator within the processor;
wherein at least one of the processor, the memory unit, the graphics processing unit, the antenna, the display, the battery, the power amplifier, and the voltage regulator comprises the at least one IC structure.

24. An integrated circuit (IC) structure, comprising:
an interlayer dielectric (ILD) material;
an interconnect comprising electrically conductive material and including a first portion proximate to a first end of the interconnect and a second portion proximate to a second end of the interconnect, the first end extending to or into the ILD material and the second end opposite the first end;
a liner material around the first portion of the interconnect and between the first end of the interconnect and the ILD material, wherein an end of the liner material opposite the first end of the interconnect defines a boundary between the first portion of the interconnect and the second portion of the interconnect; and
a remnant of a hermetic liner material in contact with the ILD material and adjacent to at least part of the first portion of the interconnect, wherein the liner material is between the interconnect and the ILD material and between the interconnect and the remnant of the hermetic liner material.

25. An integrated circuit (IC) structure, comprising:
an interlayer dielectric (ILD) material;
an interconnect comprising electrically conductive material and including a first portion proximate to a first end of the interconnect and a second portion proximate to a second end of the interconnect, the first end extending to or into the ILD material and the second end opposite the first end; and
a liner material around the first portion of the interconnect and between the first end of the interconnect and the ILD material, wherein an end of the liner material opposite the first end of the interconnect defines a boundary between the first portion of the interconnect and the second portion of the interconnect, wherein a distance from the second end of the interconnect to the first portion of the interconnect is about eighty percent (80%) of a total length of the interconnect from the first end to the second end.

26. An integrated circuit (IC) structure, comprising:
an interlayer dielectric (ILD) material;
an interconnect comprising electrically conductive material and including a first portion proximate to a first end of the interconnect and a second portion proximate to a second end of the interconnect, the first end extending to or into the ILD material and the second end opposite the first end;
a liner material around the first portion of the interconnect and between the first end of the interconnect and the ILD material, wherein an end of the liner material opposite the first end of the interconnect defines a boundary between the first portion of the interconnect and the second portion of the interconnect; and
an air gap adjacent to the second portion of the interconnect.

27. An integrated circuit (IC) structure, comprising:
an interlayer dielectric (ILD) material;
an interconnect comprising electrically conductive material and including a first portion proximate to a first end of the interconnect and a second portion proximate to a second end of the interconnect, the first end extending to or into the ILD material and the second end opposite the first end;
a liner material around the first portion of the interconnect and between the first end of the interconnect and the ILD material, wherein an end of the liner material opposite the first end of the interconnect defines a boundary between the first portion of the interconnect and the second portion of the interconnect; and
a replacement ILD material adjacent to the second portion of the interconnect.

* * * * *